Figure 1:
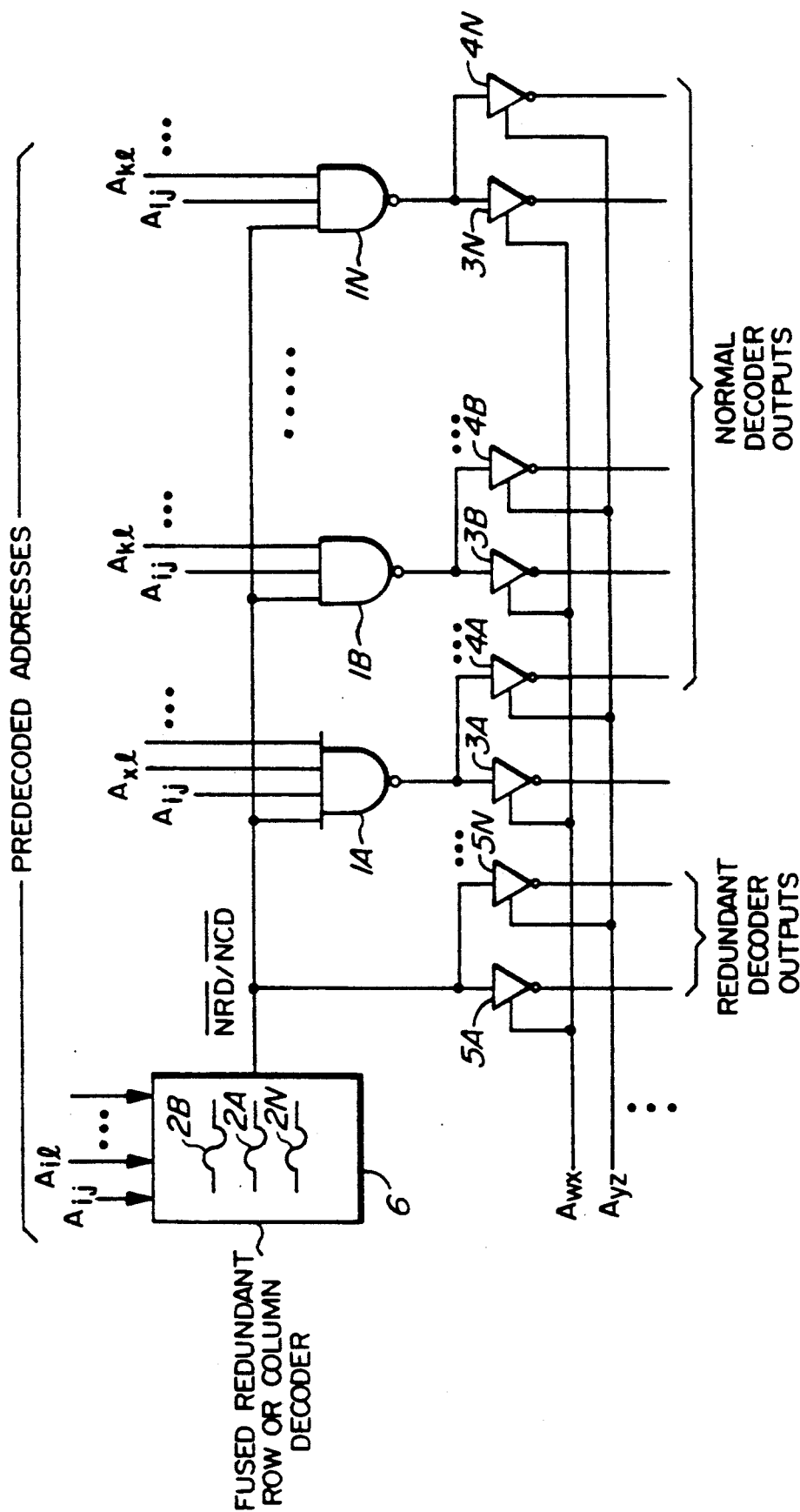

United States Patent [19]

Foss et al.

[11] Patent Number: 5,245,576
[45] Date of Patent: Sep. 14, 1993

[54] DYNAMIC MEMORY ROW/COLUMN REDUNDANCY SCHEME

[76] Inventors: Richard C. Foss, P.O. Box 13285, Kanata, Ontario, Canada, K2K 1X4; Valerie L. Lines, 228 Royal Avenue, Ottawa, Ontario, Canada, K2A 1T7; Akira Yoneyama, 57-1 Sumiyoshi, Oizumi Ora, Gunma, Japan

[21] Appl. No.: 680,995

[22] Filed: Apr. 5, 1991

[30] Foreign Application Priority Data

Apr. 6, 1990 [GB] United Kingdom ............... 9007796

[51] Int. Cl.⁵ .................................................. G11C 7/00
[52] U.S. Cl. ................................ 365/200; 365/230.06
[58] Field of Search ............... 365/200, 230.06, 225.7; 307/449

[56] References Cited

U.S. PATENT DOCUMENTS

| | | | |
|---|---|---|---|
| 4,587,638 | 5/1986 | Isobe | 365/200 |
| 4,791,319 | 12/1988 | Tagami | 365/200 |
| 4,829,481 | 5/1989 | Johnson | 365/200 |
| 4,881,202 | 11/1989 | Tsujimoto | 365/225.7 |
| 4,972,105 | 11/1990 | Burton | 365/225.7 |
| 5,103,426 | 4/1992 | Hidaka | 365/230.6 |
| 5,107,464 | 4/1992 | Sahara | 365/230.6 |
| 5,126,973 | 6/1992 | Gallia | 365/230.6 |

Primary Examiner—Eugene R. LaRoche
Assistant Examiner—A. Zarabian
Attorney, Agent, or Firm—Antonelli, Terry, Stout & Kraus

[57] ABSTRACT

A DRAM row or column decoder having a fused stage for disabling defective rows or columns. A fuse is placed within a stage preceding the final output stage of a multi-stage row or column decoder. Because the fuse is not placed within the output stage, it is not necessary to have one fuse for each individual row or column; a single fuse can disable several decoder outputs, and thus several rows or columns can be disabled at the same time.

8 Claims, 3 Drawing Sheets

DYNAMIC MEMORY ROW/COLUMN REDUNDANCY SCHEME

FIELD OF THE INVENTION

This invention relates to a dynamic random access memory (DRAM) and in particular to DRAM row or column disabling circuitry.

BACKGROUND TO THE INVENTION

DRAM memory arrays are formed of word lines (rows) and bit lines (columns) and memory cells located adjacent the intersections of the row and bit lines. Upon addressing a word line and a bit line, a memory cell coupled to the addressed word line and bit line can be written to or read from. To perform the addressing, address decoders decode address signals received from a memory controller and after decoding apply logic signals to row or column access field effect transistors.

Because memories sometimes have defects, it is common to include extra, redundant rows and columns to improve memory manufacturing yield. If a defect is found at one or more memory locations during testing, fusible links can be blown, e.g. by means of a laser beam, to eliminate the possible use of the defective rows or columns and substitute the redundant rows or columns in their place, thereby allowing the device to be used.

In large memories having very small geometric features, physical disconnection by the use of fusible links at each bit line or word line is difficult to achieve.

DESCRIPTION OF THE PRIOR ART

DRAM devices utilize "normal row/column disable" inputs to each address decoder which prevent the activation of normal rows or columns when an address corresponding to a defective row or column is detected. The addresses of defective rows or columns are programmed by selectively blowing fuses in a redundant row or column decoder. Normal row and column decoders must be prevented from being activated before the disable signal is resolved, which thereby slows down memory access time.

SUMMARY OF THE PRESENT INVENTION

In the present invention, instead of generating a normal row/column disable signal, a fuse is placed within a stage preceding the final output stage of a multi-stage row or column decoder. Because the fuse is not placed within the output stage, it is not necessary to have one fuse for each individual row or column; a single fuse can disable several decoder outputs, and thus several rows or columns can be disabled at the same time.

Therefore a normal row/column disable signal is not required to be input for each decoder, thus eliminating the requirement to slow down the memory access time for the reason of preventing the normal row and column decoders from being activated before the normal row/column disable signal is resolved. The result is an increase in memory access time.

An embodiment of the present invention is a dynamic random access memory (DRAM) row or column address decoder comprised of apparatus for receiving a row or column address, a multi-stage decoder for the address, a fuse in a stage preceding the output stage, apparatus in said preceding stage connected to the fuse and connected to the output stage for maintaining the output stage inoperative upon the fuse being open circuited, and for maintaining said preceding and the output stage operative upon the fuse being continuous and conductive, whereby the address decoder for a single row or address is maintained inoperative or operative depending on whether the fuse is open circuited or not.

In accordance with a more particular embodiment, in the above embodiment the output stage is comprised of a first gate enabled by said preceding stage and upon receiving a portion of the address, and in which said preceding stage is comprised of a second gate enabled upon receiving a remaining portion of the address, the fuse being located in said preceding stage in a circuit connected to an input of the first gate whereby the latter input is pulled to a voltage for inhibiting operation of the first gate when the fuse is open circuited.

BRIEF INTRODUCTION TO THE DRAWINGS

Figure 2:
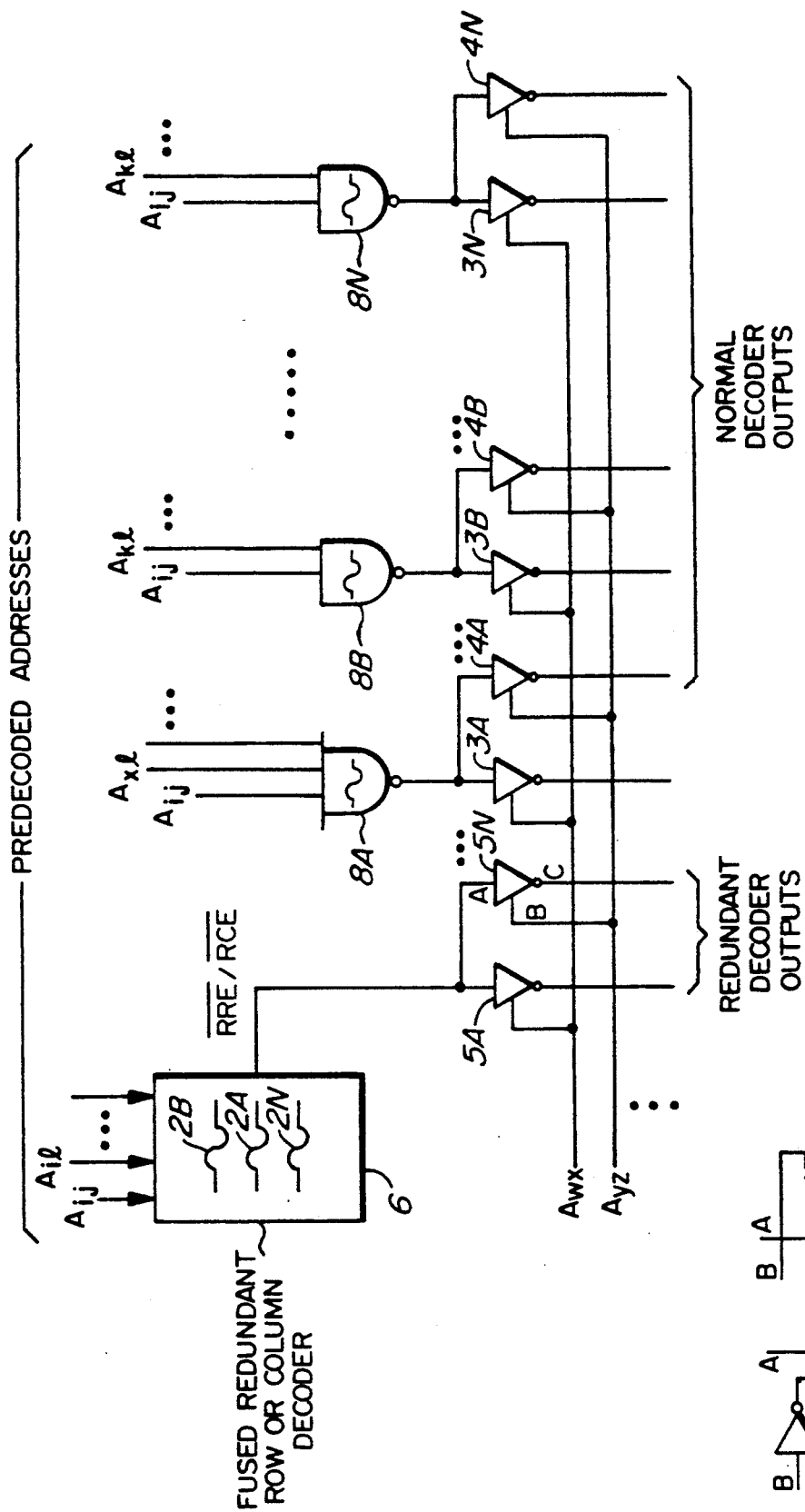
Figure 2A:
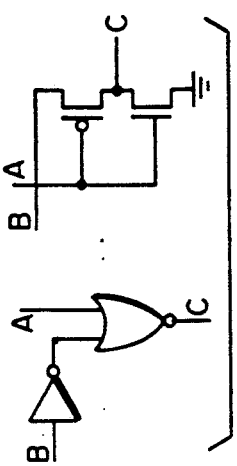
Figure 3:
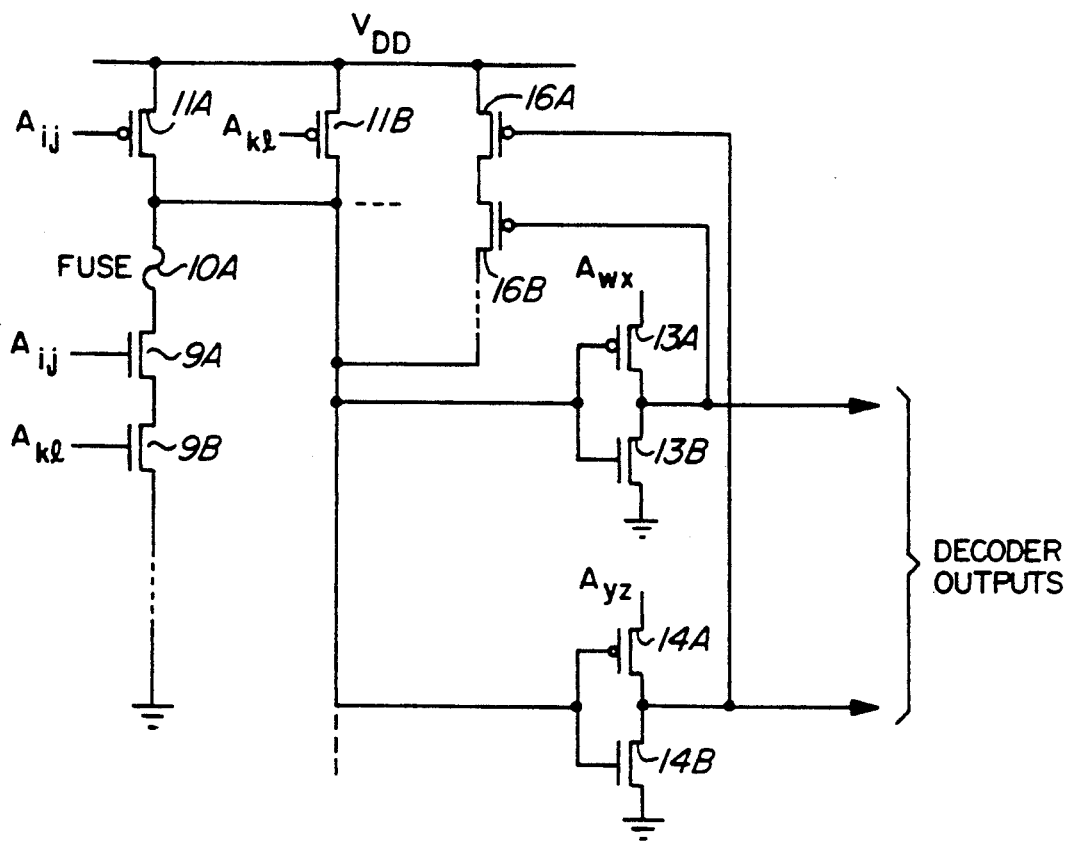
Figure 4:
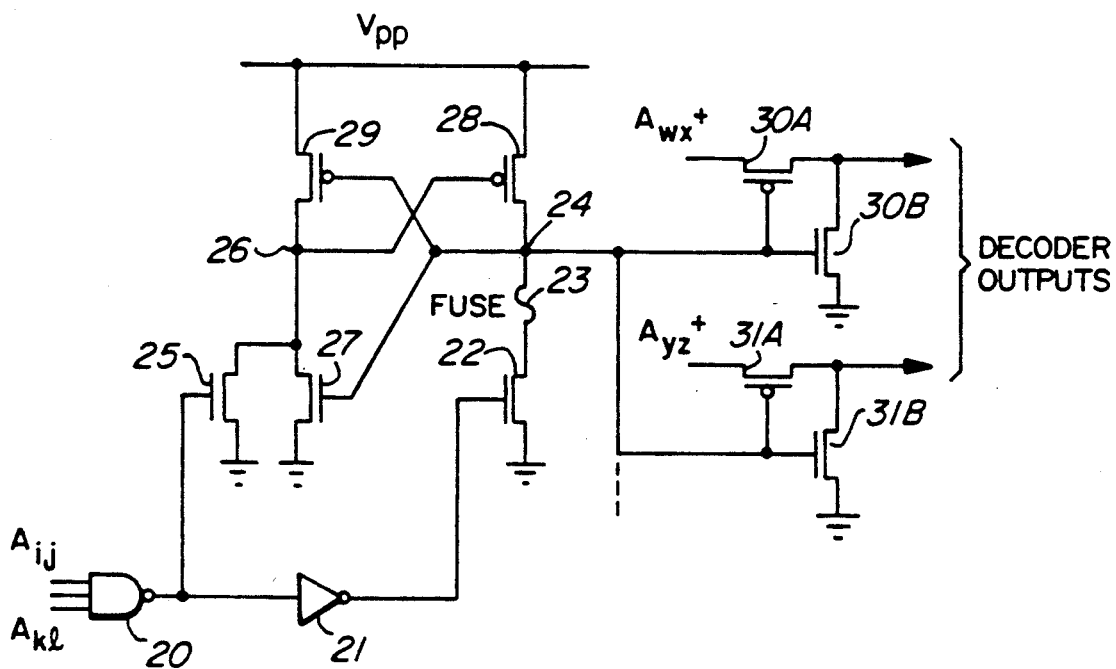

A better understanding of the invention will be obtained by reference to the detailed description below, in conjunction with the following drawings, in which:

FIG. 1 is a logic diagram of an address decoder in accordance with the prior art, FIG. 2 is a logic diagram of an address decoder in accordance with the present invention, FIG. 2A illustrates some forms of alternative output gates that can be used in the address decoder, FIG. 3 is a schematic diagram of an embodiment of a column decoder in accordance with the invention, and FIG. 4 is a schematic diagram of an embodiment of a row decoder in accordance with the invention.

Turning first to FIG. 1, a row or column driver is shown as in the prior art. A plurality of NAND gates 1A, 1B ... 1N have a plurality of inputs $A_{ij}$, $A_{kl}$ ... representing a first portion of predecoded addresses.

A common input to each of the NAND gates, active low signal $\overline{NRD}/\overline{NCD}$ (normal row disable, normal column disable), is connected to a fused redundant row or column decoder 6 with an array of fuses 2A, 2B, 2C, etc. for programming defective addresses.

The outputs of NAND gates 1A-1N are connected to the inputs of corresponding gates 3A-3N, and to the inputs of corresponding gates 4A-4N. The enable inputs of gates 3A-3N are connected to an address line $A_{wx}$, the inputs to gates 4A-4N are connected to an address line $A_{yz}$, and the inputs to other gates having their inputs connected in parallel with gates 3A-3N are connected to other address lines.

Output gates 3A-3N can be either source enabled inverters or full CMOS NOR gates with inverters in the enable path.

The outputs of gates 3A, 4A, etc.-3N, 4N, etc. are normal decoder outputs, which are connected to the gates of row and column access transistors, not shown.

In addition, the line connecting redundant decoder 6 to the inputs of each of the gates 1A-1N is connected without passing through a NAND gate to the inputs of gates 5A-5N which have enable inputs connected to the address lines $A_{wx}$, $A_{wz}$, etc. similar to the output gates already described, and outputs which are redundant decoder outputs.

Other fuses 2B-2M are connected to corresponding inputs of other NAND gates of other decoders in a manner similar to that just described.

In operation, predecoded addresses are applied to the address inputs $A_{ij}$, $A_{kl}$ and to the address lines $A_{wx}$, $A_{wz}$, etc. NAND gates 1A-1N and the gates 3A-3N, 4A-4N, decode the addresses in a well known manner, applying logic signals at the normal decoder outputs to the access transistors of a row or column.

In case this decoder is to be disabled, appropriate fuses in the redundant decoder 6 are blown, causing them to be open circuited, so that the $\overline{\text{NRD}}/\overline{\text{NCD}}$ signal goes low when this decoder is selected, disabling the decoder.

Upon addressing decoder 6 and upon addressing the gates 1A-1N as described above, the $\overline{\text{NRD}}/\overline{\text{NCD}}$ line is pulled low, inhibiting NAND gates 1A-1N, and then not allowing the associated row or column addressed thereby to be enabled. On the other hand, with a low logic signal on $\overline{\text{NRD}}/\overline{\text{NCD}}$ applied to the inputs of gates 5A-5N, high level logic signals appear at their outputs upon being addressed. This signal is used as a substitute decoder output to drive a substitute row or column in place of the faulty one whose addressing was disabled.

It may be seen that the address applied to the address decoder 6 must be resolved before NAND gates 1A-1N can be addressed; otherwise their common input may be at high level, allowing the faulty row or column to be addressed. Thus the addressing of the NAND gates 1A-1N must be slowed, slowing down memory access time.

FIG. 2 illustrates the improvement in accordance with the present invention. While the description is given with a two stage decoder as an example, the same principles are applicable to a multi-stage decoder.

In FIG. 2 the gates 3A-3N, 4A-4N, 5A-5N are connected as described with respect to FIG. 1, including the partial address inputs $A_{wx}$, $A_{yz}$, etc. In addition, address decoder 6 with fuses 2A, 2B, 2M are as described with respect to FIG. 1, except that its output signal has been renamed $\overline{\text{RRE}}/\overline{\text{RCE}}$(redundant row enable, redundant column enable).

However in FIG. 2 first stage decoder gates 8A-8N, having inputs driven by the other portion of the address $A_{ij}$, $A_{kl}$, are themselves separately fused. The outputs of each of gates 8A-8N are connected to the inputs of gates 3A-3N, 4A-4N, as described earlier with respect to gates 1A-1N.

In FIG. 2, however, there is no common gate input to gates 8A-8N as there is with gates 1A-1N, and no common gate input connected to redundant decoder 6. Instead the inputs of redundant gates 5A-5N are connected to redundant decoder 6.

In the present invention, with a fuse blown in any of the gates 8A-8N, the corresponding first stage decoder is disabled, making the second stage gates that are connected to the disabled stage inoperative. There is no need to slow down the addressing to wait for the disable input to be generated to the decoder from the fuse array. The output of redundant decoder 6 activates gates 5A-5N, thus enabling the redundant, substitute row or column.

Alternative output gates are shown in FIG. 2A.

FIG. 3 is a schematic diagram of a preferred embodiment of a column decoder, utilizing the principles of this invention.

A group of N-channel field effect field effect transistors 9A-9P have their source-drain circuits connected in series, one end of the series being connected to ground. The other end of the series is connected to a fuse 10A, which has its other end connected through the source-drain circuit of a P-channel field effect transistor 11A to a power supply rail $V_{DD}$. Field effect transistor 11A is part of a group of P-channel field effect transistors IIA-IIP having their sources and drains connected in parallel. The gates of field effect transistors 11A-11P are connected in parallel with the gates of 9A-9P respectively to address lines $A_{ij}$, $A_{kl}$, etc.

The junction of field effect transistors IIA-11P and the fuse 10A are connected to the gates of P and N-channel field effect transistor pairs 13A-13B, 14A-14B, etc. The source-drain circuits of each field effect transistor pair are connected between ground and address lines $A_{wx}$, $A_{yz}$, etc., which provide a portion of the column address.

The junctions of the source drain circuits of the field effect transistor pairs are connected to respective gates of P-channel field effect transistors 16A, 16B, etc. The source-drain circuits of field effect transistors 16A, 16B etc. are all connected in series between $V_{DD}$ and the junction of field effect transistors 11A-11P, and the fuse.

The outputs of the field effect transistor pairs form the decoder outputs.

In operation, assuming that the fuse is intact and conductive, high logic level addresses applied to the gates of field effect transistors 11A-11P and 9A-9P cause field effect transistors 9A-9P to be conductive, and effect transistors 11A-11P to be non-conductive. This causes the gates of the field effect transistor pairs 13A, 13B, 14A-14B, etc. to go to a low level, causing field effect transistors 13A, 14A to become conductive. The logic level of the addresses $A_{wx}$ and $A_{yz}$ thus appear at the decoder outputs. The decoder outputs are fed back to the gates of field effect transistors 16A-16B, causing those transistors to turn off.

Conversely, if any of the signals $A_{ij}$, $A_{kl}$, $A_{wx}$, and $A_{yz}$ are low level, the series path through transistors 9A-9P becomes non-conductive and at least one of field effect transistors 11A-11P becomes conductive. This causes the junction of field effect transistors 11A, 11B and the fuse to rise to $V_{DD}$, high level, causing conduction of field effect transistors 13B, 14B, etc. and non-conduction of field effect transistors 13A, 14A, etc. The decoder outputs thus are brought to ground level through field effect transistors 13B, 14B, etc., and field effect transistors 16B, 16C are enabled to become conductive.

If fuse 10A has been blown to disable the column, creating an open circuit, the junction of field effect transistors 11A, 11B and the fuse will remain at $V_{DD}$. While the memory is inactive the address inputs $A_{ij}$, $A_{kl}$ will all be low, turning on transistors 11A, 11P to bring the junction of transistors 11A, 11P and the fuse to $V_{DD}$. This in turn forces all decoder outputs low and turns on the series chain formed by transistors 16A, 16B. When the memory enters active mode, address inputs $A_{ij}$, $A_{kl}$ may go high but the junction of transistors 11A, 11P and the fuse remains at $V_{DD}$ by the action of the series chain formed by transistors 16A, 16B which remain enabled. This maintains the decoder outputs at high logic level, disabling the column decoder.

A preferred form of a row decoder is shown in FIG. 4. Address inputs $A_{ij}$, $A_{kl}$, etc. are connected to the inputs of a NAND gate 20. The output of NAND gate 20 is connected to the input of inverter 21, which is connected to the gate of N-channel field effect transistor 22. The source-drain circuit of field effect transistor 22 is connected between ground and a fuse 23, which has its other end connected to a node 24.

The output of NAND gate 20 is also connected to the gate of N-channel field effect transistor 25, which has its source-drain circuit connected between ground and a node 26. Another N-channel field effect transistor 27 has its source-drain circuit connected in parallel with that of field effect transistor 25, and its gate connected to node 24.

A pair of P-channel field effect transistors 28 and 29 have their source-drain circuits connected to a source of high logic level $V-_{pp}$, and to nodes 24 and 26 respectively. The gate of field effect transistor 29 is connected to node 24 and the gate of field effect transistor 28 is connected to node of gate 26.

The circuit described above forms a level shifter, producing a decoded output at node 24 at logic levels between ground and $V_{pp}$, the boosted word line supply, which operates upon being addressed via gate 20.

Node 24 is connected to the gates of field effect transistor pairs comprised of P-channel field effect transistor 30A and N-channel field effect transistor 30B, P-channel field effect transistor 31A and N-channel field effect transistor 31B, etc. The source-drain circuits of the field effect transistor pairs are connected in series between ground and corresponding address portion signal inputs $A_{wx}$, $A_{yz}$, etc. The shared node of the field effect transistor pairs drive the word line and are connected to the gates of row access transistors (not shown), in order to enable the respective row.

In operation, with high level address signals applied to inputs $A_{ij}$, $A_{kl}$, the output of NAND gate 20 goes to low logic level, and the output of inverter 21 goes to high logic level. Field effect transistor 22 is thus enabled, bringing node 24 to ground, inhibiting transistors 30B, 31B, etc. and enabling transistors 30A, 30B etc. Boosted addresses $A_{wx}+$, $A_{yz}+$, etc. are thereby conducted to the gates of the row access transistors, enabling the corresponding rows.

The low level output of NAND gate 20 applied to the gate of field effect transistor 25, inhibits it. However ground at node 24 enables transistor 29, bringing node 26 to high logic level $V_{pp}$. This inhibits operation of field effect transistor 28.

Should the $A_{ij}$, $A_{kl}$ inputs of NAND gate 20 go to low level, its output goes to high logic level, the output of inverter 21 to low logic level, causing field effect transistor 22 be inhibited. Transistor 25 conducts, bringing node 26 to ground, enabling operation of field effect transistor 28, raising node 24 to $V_{pp}$.

High logic level on node 24 also causes inhibition of field effect transistors 30A, 31A, etc., and causing operation of field effect transistors 30B, 31B, etc., bringing the decoder outputs to ground, inhibiting operation of the row access transistors.

Assume now that the row decoder outputs are to be permanently disabled. Fuse 23 is blown by means of a laser beam or other means in a well known manner.

Now when high level inputs $A_{ij}$, $A_{kl}$, etc. are applied to the NAND inputs of gate 20, field effect transistor 22 cannot be enabled due to the fuse being open circuited. Transistor 27 is enabled due to a high level on node 24, which in turn pulls node 26 low to turn on transistor 28, maintaining a high level on node 24 regardless of the state of address inputs $A_{ij}$, $A_{kl}$. As a result node 24 is maintained at high level $V_{pp}$, and field effect transistors 30A, 31A, etc. can never be enabled. Transistors 30B, 31B, etc. having their gates at high level $V_{pp}$, connect the row access transistor lines (decoder outputs) to ground.

Thus with first stage of the decoder disabled due to the blowing of fuse 23, operation of the row cannot occur.

A person understanding this invention may now conceive of alternative structures and embodiments or variations of the above. All of those which fall within the scope of the claims appended hereto are considered to be part of the present invention.

We claim:

1. A dynamic random access memory (DRAM) row or column address decoder comprising:
   (a) means for receiving a row or column address,
   (b) a multi-stage decoder having at least one preceding decoder stage serially connected to a final decoding stage for receiving and decoding said address, each stage of which receives a portion of said address for decoding thereof,
   (c) at least one fuse in said at least one stage receding said final output stage,
   (d) means in said at least one preceding stage, connecting to the fuse and connected to said final stage, for maintaining said output stage inoperative upon the fuse being open circuited, and for maintaining said preceding and said output stage operative upon the fuse being conductive,
   whereby the address decoder for a single row or column is maintained inoperative or operative depending on whether the fuse is open circuited or not.

2. A dynamic random access memory (DRAM) row or column address decoder comprising:
   (a) means for receiving a row or column address,
   (b) a multi-stage decoder for receiving and decoding said address,
   (c) at least one fuse in at least one stage preceding a final output stage,
   (d) means in said preceding stage, connecting to the fuse and connected to said final stage, for maintaining said output stage inoperative upon the fuse being open circuited, and for maintaining said preceding and said output stage operative upon the fuse being conductive,
   said output stage being comprised of a first gate for being enabled from said first stage and by a portion of said address, and in which said preceding stage is comprised of a second gate driven from a remaining portion of said address, said fuse being located in said preceding stage in a circuit connected to an input to said first gate whereby said latter input is pulled to a voltage sufficient to inhibit operation of said first gate when the fuse is open circuited,
   whereby the address decoder for a single row or column is maintained inoperative or operative depending on whether the fuse is open circuited or not.

3. A decoder as defined in claim 1 in which the decoder is comprised of two stages.

4. A decoder as defined in claim 2 in which the decoder is comprised to two stages.

5. A dynamic random access memory (DRAM) row or column address decoder comprising:
   (a) means for receiving a row or column address,
   (b) a multi-stage decoder for receiving and decoding said address having a final stage and at least one preceding stage, said stages being serially connected and each receiving a portion of said address for decoding,
   (c) means in said preceding stage for raising or lowering input voltage to said first stage to cause said final stage to pass or block signals therethrough, upon said preceding stage receiving said address, (d) fuse means in said preceding stage for permanently changing the input voltage to said output stage for causing said output stage to permanently block signals therethrough when said fuse is blown.

6. A decoder as defined in claim 5 in which the decoder is comprised of two stages.

7. A dynamic random access memory (DRAM) column address decoder comprising:
   (a) a first plurality of N-channel field effect transistors, the source-drain circuits thereof being connected in series, one end of the series being connected to ground,
   (b) means for applying first address signals to gates of said transistors,
   (c) a second plurality of P-channel transistors equal in number to said first plurality of transistors, the sources and drains of the P-channel transistors being connected in parallel, the sources in common being connected to a positive voltage rail,
   (d) a fuse connected between the drains in common of said P-channel transistors and the other end of the series of N-channel transistors,
   (e) pairs of P and N-channel transistors, each pair having their gates connected together and to the drains in common of the second plurality of P-channel transistors, the source and drain circuits of each pair being connected in series with one end thereof to ground, the junction between the source and drain circuit of each pair forming a decoder output,
   (f) means for applying second address signals to other end of the source-drain circuits of each transistor pair, the number of second address signals defining the number of said pairs of P and N-channel transistors,
   (g) a third plurality of P-channel transistors, equal in number to the number of said pairs of transistors, the source-drain circuits of the third plurality of transistors being connected in series between said positive voltage rail and said sources in common of said second plurality of P-channel transistors, the gates of the third plurality of transistors being connected to respective ones of said decoder outputs, the first, second and third plurality of transistors and said fuse forming a first decoder stage that can be disabled by blowing said fuse and said pairs of transistors forming a second decoder stage, which can be locked up by said blowing of said fuse.

8. A dynamic random access memory (DRAM) row address decoder comprising:
   (a) a first stage comprising:
      (i) a NAND gate for receiving first address signals at inputs thereof,
      (ii) an inverter having its input connected to the output of the NAND gate,
      (iii) a first N-channel field effect transistor (FET) having its gate connected to the output of the inverter and its source connected to ground,
      (iv) a fuse connecting the drain of the first FET to a first node,
      (v) second and third N-channel FETs having their sources and drains connected in parallel, their sources connected to ground, the gate of the second FET connected to the output of the NAND gate, the gate of the third FET connected to the first node, and their drains connected to a second node,
      (vi) first and second P-channel FETs having their sources connected together to a source of positive voltage $V_{pp}$, the drain of the first P-channel FET and the gate of the second P-channel FET connected to the first node, the drain of the second P-channel FET and the gate of the first P-channel FET connected to the second node,
   (b) and a second stage comprising:
      (vii) a plurality of pairs of FETs, one FET of each pair being P-channel type and one FET of each pair being N-channel type, the source and drains of each pair being connected in series, one end of each series being connected to ground, the other end of each series being connected to sources of second address signals, the gates of all of the pairs being connected to said first node, the junctions of the sources and drains of said pairs of FET forming decoder outputs,
   whereby open circuiting of the fuse in said first stage disables operation of said second stage.

* * * * *